United States Patent
Li et al.

(10) Patent No.: US 6,592,439 B1
(45) Date of Patent: Jul. 15, 2003

(54) PLATEN FOR RETAINING POLISHING MATERIAL

(75) Inventors: Shijian Li, San Jose, CA (US); Manoocher Birang, Los Gatos, CA (US); Ramin Emami, San Jose, CA (US); Andrew Nagengast, Sunnyvale, CA (US); Douglas Orcutt Brown, San Jose, CA (US); Shi-Ping Wang, Fremont, CA (US); Martin Scales, San Jose, CA (US); John White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/709,769

(22) Filed: Nov. 10, 2000

(51) Int. Cl.⁷ ............................................. B24B 29/00
(52) U.S. Cl. ...................................... 451/289; 451/296
(58) Field of Search ................... 451/285, 286, 451/287, 288, 289, 296, 300, 303, 41

(56) References Cited

U.S. PATENT DOCUMENTS

| | | |
|---|---|---|
| 1,353,967 A | 9/1920 | Lorenz |
| 1,665,749 A | 4/1928 | Mattison |
| 2,646,654 A | 7/1953 | Brink |
| 3,376,578 A | 4/1968 | Sawyer |

(List continued on next page.)

FOREIGN PATENT DOCUMENTS

| | | |
|---|---|---|
| DE | 225093 | 8/1910 |
| DE | 1037308 | 1/1957 |
| DE | 1104379 | 4/1961 |
| EP | 0517594 A1 | 12/1992 |
| EP | 0 653 270 A1 | 5/1995 |
| EP | 0696495 A1 | 2/1996 |
| EP | 0756917 A1 | 2/1997 |
| EP | 0770455 A1 | 5/1997 |
| EP | 0774323 A2 | 5/1997 |
| EP | 0774323 A3 | 10/1997 |
| EP | 0818272 A1 | 1/1998 |
| EP | 1 031 398 A2 | 8/2000 |
| EP | 1052063 A1 | 11/2000 |
| JP | 59037051 | 2/1984 |
| JP | 60-228070 | 11/1985 |
| JP | 62-162466 | 7/1987 |
| JP | 2-269553 | 11/1990 |
| JP | 402269553 A | 11/1990 |

(List continued on next page.)

OTHER PUBLICATIONS

Sommer, et al., "Polishing Media Stabilizer", U.S. patent application No. 09/258,036, filed Feb. 25, 1999.
Butterfield, et al., "Platen With Web Release Apparatus", U.S. patent application No. 09/676,395, filed Sep. 29, 2000.
Franklin, et al., "Integrated Platen Assembly for a Chemical Mechanical Planarization System", U.S. patent application No. 09/931,156, filed Aug. 16, 2001.
White, et al., "Web Lift System for Chemical Mechanical Planarization", U.S. patent application No. 09/651,657, filed Aug. 29, 2000.
International Search Report for PCT/US01/43725, dated Jul. 24, 2002.

*Primary Examiner*—Dung Van Nguyen
(74) *Attorney, Agent, or Firm*—Moser, Patterson & Sheridan

(57) ABSTRACT

Generally, a method and apparatus for retaining polishing material is provided. In one embodiment, the apparatus includes a platen having a top surface, a plurality of channels and one or more vacuum ports. The top surface is adapted to support the polishing material. The plurality of channels are formed in a polishing area of the top surface. The vacuum ports are disposed in the platen and at least one port is in communication with at least one of the channels. Upon application of a vacuum to the ports, the channels remove fluids under the polishing material while securing the polishing material to the top surface.

43 Claims, 5 Drawing Sheets

U.S. PATENT DOCUMENTS

| | | |
|---|---|---|
| 3,929,551 A | 12/1975 | Frantzen |
| 4,347,689 A | 9/1982 | Hammond |
| 4,373,991 A | 2/1983 | Banks |
| 4,412,400 A | 11/1983 | Hammond |
| 4,521,995 A | 6/1985 | Sekiya |
| 4,571,799 A | 2/1986 | Chitayat |
| 4,603,867 A | 8/1986 | Babb et al. |
| 4,642,943 A | 2/1987 | Taylor, Jr. |
| 4,910,155 A | 3/1990 | Cote et al. |
| 4,918,870 A | 4/1990 | Torbert et al. |
| 5,036,630 A | 8/1991 | Kaanta et al. |
| 5,065,547 A | 11/1991 | Shimizu et al. |
| 5,076,024 A | 12/1991 | Akagawa et al. |
| 5,081,795 A | 1/1992 | Tanaka et al. |
| 5,088,240 A | 2/1992 | Ruble et al. |
| 5,099,615 A | 3/1992 | Ruble et al. |
| 5,197,999 A | 3/1993 | Thomas |
| 5,209,027 A | 5/1993 | Ishida et al. |
| 5,212,910 A | 5/1993 | Breivogel et al. |
| 5,216,843 A | 6/1993 | Breivogel et al. |
| 5,232,875 A | 8/1993 | Tuttle et al. |
| 5,234,867 A | 8/1993 | Schultz et al. |
| 5,276,999 A | 1/1994 | Bando |
| 5,299,393 A | 4/1994 | Chandler et al. |
| 5,329,732 A | 7/1994 | Karlsrud et al. |
| 5,335,453 A | 8/1994 | Baldy et al. |
| 5,377,451 A | 1/1995 | Leoni et al. |
| 5,384,986 A | 1/1995 | Hirose et al. |
| 5,398,459 A | 3/1995 | Okumura et al. |
| 5,399,125 A | 3/1995 | Dozier |
| 5,423,716 A | 6/1995 | Strasbaugh |
| 5,476,413 A | 12/1995 | Hasegawa et al. |
| 5,486,129 A | 1/1996 | Sandhu et al. |
| 5,487,697 A | 1/1996 | Jensen |
| 5,490,808 A | 2/1996 | Jantschek et al. |
| 5,498,196 A | 3/1996 | Karlsrud et al. |
| 5,498,199 A | 3/1996 | Karlsrud et al. |
| 5,516,400 A | 5/1996 | Pasch et al. |
| 5,522,965 A | 6/1996 | Chisholm et al. |
| 5,527,209 A | 6/1996 | Volodarsky et al. |
| 5,527,424 A | 6/1996 | Mullins |
| 5,529,638 A | 6/1996 | Lutz |
| 5,531,861 A | 7/1996 | Yu et al. |
| 5,533,923 A | 7/1996 | Shamouilian et al. |
| 5,536,202 A | 7/1996 | Appel et al. |
| 5,542,874 A | 8/1996 | Shikaki |
| 5,547,417 A | 8/1996 | Breivogel et al. |
| 5,548,505 A | 8/1996 | Simmons et al. |
| 5,549,511 A | 8/1996 | Cronin et al. |
| 5,554,064 A | 9/1996 | Breivogel et al. |
| 5,554,065 A | 9/1996 | Clover |
| 5,558,563 A | 9/1996 | Cote et al. |
| 5,558,568 A | 9/1996 | Talieh et al. |
| 5,562,524 A | 10/1996 | Gill, Jr. |
| 5,562,529 A | 10/1996 | Kishii et al. |
| 5,564,965 A | 10/1996 | Tanaka et al. |
| 5,569,062 A | 10/1996 | Karlsrud |
| 5,575,706 A | 11/1996 | Tsai et al. |
| 5,578,529 A | 11/1996 | Mullins |
| 5,582,534 A | 12/1996 | Shendon et al. |
| 5,593,344 A | 1/1997 | Weldon et al. |
| 5,593,537 A | 1/1997 | Cote et al. |
| 5,595,529 A | 1/1997 | Cesna et al. |
| 5,597,346 A | 1/1997 | Hempel, Jr. |
| 5,599,423 A | 2/1997 | Parker et al. |
| 5,605,499 A | 2/1997 | Sugiyama et al. |
| 5,611,943 A | 3/1997 | Cadien et al. |
| 5,624,299 A | 4/1997 | Shendon |
| 5,635,083 A | 6/1997 | Breivogel et al. |
| 5,643,044 A | 7/1997 | Lund |
| 5,643,053 A | 7/1997 | Shendon |
| 5,643,056 A | 7/1997 | Hirose et al. |
| 5,643,067 A | 7/1997 | Katsuoka et al. |
| 5,645,471 A | 7/1997 | Strecker |
| 5,660,581 A | 8/1997 | Shin et al. |
| 5,676,590 A | 10/1997 | Hiraoka |
| 5,679,064 A | 10/1997 | Nishi et al. |
| 5,692,947 A | 12/1997 | Talieh et al. |
| 5,704,827 A | 1/1998 | Nishi et al. |
| 5,718,620 A | 2/1998 | Tanaka et al. |
| 5,722,877 A | 3/1998 | Meyer et al. |
| 5,738,574 A | 4/1998 | Tolles et al. |
| 5,759,918 A | 6/1998 | Hoshizaki et al. |
| 5,762,536 A | 6/1998 | Pant et al. |
| 5,791,969 A | 8/1998 | Lund |
| 5,792,709 A | 8/1998 | Robinson et al. |
| 5,795,218 A | 8/1998 | Doan et al. |
| 5,800,248 A | 9/1998 | Pant et al. |
| 5,851,136 A | 12/1998 | Lee |
| 5,853,317 A | 12/1998 | Yamamoto |
| 5,871,390 A | 2/1999 | Pant et al. |
| 5,873,769 A | 2/1999 | Chiou et al. |
| 5,879,424 A | 3/1999 | Nishii et al. |
| 5,897,426 A | 4/1999 | Somekh |
| 5,899,801 A | 5/1999 | Tolles et al. |
| 5,906,532 A | 5/1999 | Nakajima et al. |
| 5,916,012 A * | 6/1999 | Pant et al. ............... 451/41 |
| 5,921,852 A | 7/1999 | Kimura et al. |
| 5,954,912 A | 9/1999 | Moore |
| 5,961,372 A | 10/1999 | Shendon |
| 5,997,348 A | 12/1999 | Shepherd |
| 6,022,807 A | 2/2000 | Lindsey, Jr. et al. |
| 6,033,293 A * | 3/2000 | Crevasse et al. ............ 451/494 |
| 6,062,959 A | 5/2000 | Weldon et al. |
| 6,068,542 A | 5/2000 | Hosokai |
| 6,102,777 A | 8/2000 | Duescher et al. |
| 6,135,859 A | 10/2000 | Tietz |
| 6,149,506 A | 11/2000 | Duescher |
| 6,207,572 B1 | 3/2001 | Talieh |
| 6,220,942 B1 | 4/2001 | Tolles et al. |
| 6,241,585 B1 | 6/2001 | White |
| 6,244,935 B1 | 6/2001 | Birang et al. |
| 6,273,796 B1 | 8/2001 | Moore |
| 6,273,800 B1 | 8/2001 | Walker et al. |
| 6,331,139 B2 | 12/2001 | Walker et al. |

FOREIGN PATENT DOCUMENTS

| | | |
|---|---|---|
| JP | 03028371 | 2/1991 |
| JP | 4-53682 | 2/1992 |
| JP | 4-250967 | 9/1992 |
| JP | 7-111256 | 4/1996 |
| JP | 09029634 | 2/1997 |
| JP | 9-225821 | 2/1997 |
| JP | 9248753 | 9/1997 |
| JP | 02000353679 A | 12/2000 |
| JP | 02001071250 A | 3/2001 |
| WO | WO 93/02837 | 2/1993 |

\* cited by examiner

PLATEN FOR RETAINING POLISHING MATERIAL

BACKGROUND OF THE DISCLOSURE

1. Field of the Invention

Embodiments of the present invention relate generally to a method and apparatus for retaining polishing material in a polishing system.

2. Background of the Invention

In semiconductor wafer processing, the use of chemical mechanical planarization, or CMP, has gained favor due to the enhanced ability to increase device density on a semiconductor workpiece, or substrate, such as a wafer. As the demand for planarization of layers formed on wafers in semiconductor fabrication increases, the requirement for greater system (i.e., process tool) throughput with less wafer damage and enhanced wafer planarization has also increased.

Chemical mechanical planarization systems generally retain a substrate, or semiconductor wafer, in a polishing head. The polishing head presses the substrate against a polishing material. The polishing head and polishing material are moved relative to each other providing a polishing motion between the substrate and the polishing material. A polishing fluid is disposed between the substrate and the polishing material during polishing. The polishing fluid, which may contain abrasives, generally provides the chemical activity at the substrate's surface that aids in the removal of material from the substrate.

One type of polishing material that may be utilized for chemical mechanical polishing is known as a fixed abrasive material. The fixed abrasive material comprises a plurality of abrasive particles suspended in a resin binder that is disposed in discrete elements on a backing sheet. As the abrasive particles are contained in the polishing material itself, systems utilizing fixed abrasive material generally use polishing fluids that do not contain abrasives.

Fixed abrasive polishing material is generally available in stick-down form but is often utilized in the form of a web. Generally, the web is periodically advanced over the course of polishing a number of substrates as the polishing surface of the web is consumed by the polishing process. A vacuum is typically applied between the web and an underlying support to fix the web to the support during the polishing process. Before the web is advanced, the vacuum is removed, freeing the web from the support surface.

A problem that is periodically encountered when using webs of polishing material is maintaining the web flush with the surface of the polishing platen. For example, the web may creep in relation to the plate during polishing due to the shear forces experienced as the web and platen move in relation to a substrate that is held against the web during polishing. As the web creeps, it may wrinkle, creating a non-planar surface that may disrupt the polishing uniformity. Moreover, wrinkles extending across the vacuum sealing area at the edge of the platen and the web may cause seal failure, thus allowing the web to separate from the platen.

Additionally, bubbles of air or other gases trapped between the web and platen reduce the surface contact area between the web and platen. The reduced contact area correspondingly decreases frictional forces between the web and platen, thus disadvantageously increasing the probability that the web may creep across the platen. Moreover, wrinkles in the web tend to aggravate bubble formation between the web and platen. Bubbles under the web change the modulus of the integrated polishing material (i.e., the polishing material in combination with supporting materials) surface that directly alters the polishing results, thus creating a condition that undesirably leads to unpredictable polishing results and premature consumption of the web of polishing material. Stick-down pads experience similar problems although to a lesser extent due to increased frequency of releasing and re-securing the polishing material in web based systems.

Therefore, there is a need for a platen that improves the retention of polishing material thereon.

SUMMARY OF THE INVENTION

One aspect of the present invention generally provides an apparatus for retaining polishing material. In one embodiment, the apparatus includes a platen having a top surface, a plurality of channels and one or more vacuum ports. The top surface is adapted to support the polishing material. The plurality of channels are formed in a polishing area of the top surface. The vacuum ports are disposed in the platen and at least one port is in communication with at least one of the channels.

In another aspect of the invention, a method for retaining polishing material to a platen having at op surface that includes a network of channels bounded by a groove is provided. In one embodiment, the method includes the steps of applying vacuum to the groove disposed in the top surface, drawing a portion of fluid trapped between the polishing material and platen inward of the groove through a plurality of channels to the groove, and drawing another portion of fluid trapped between the polishing material and the platen through a plurality of vacuum ports coupled to the channels.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF INVENTION

Figure 1:
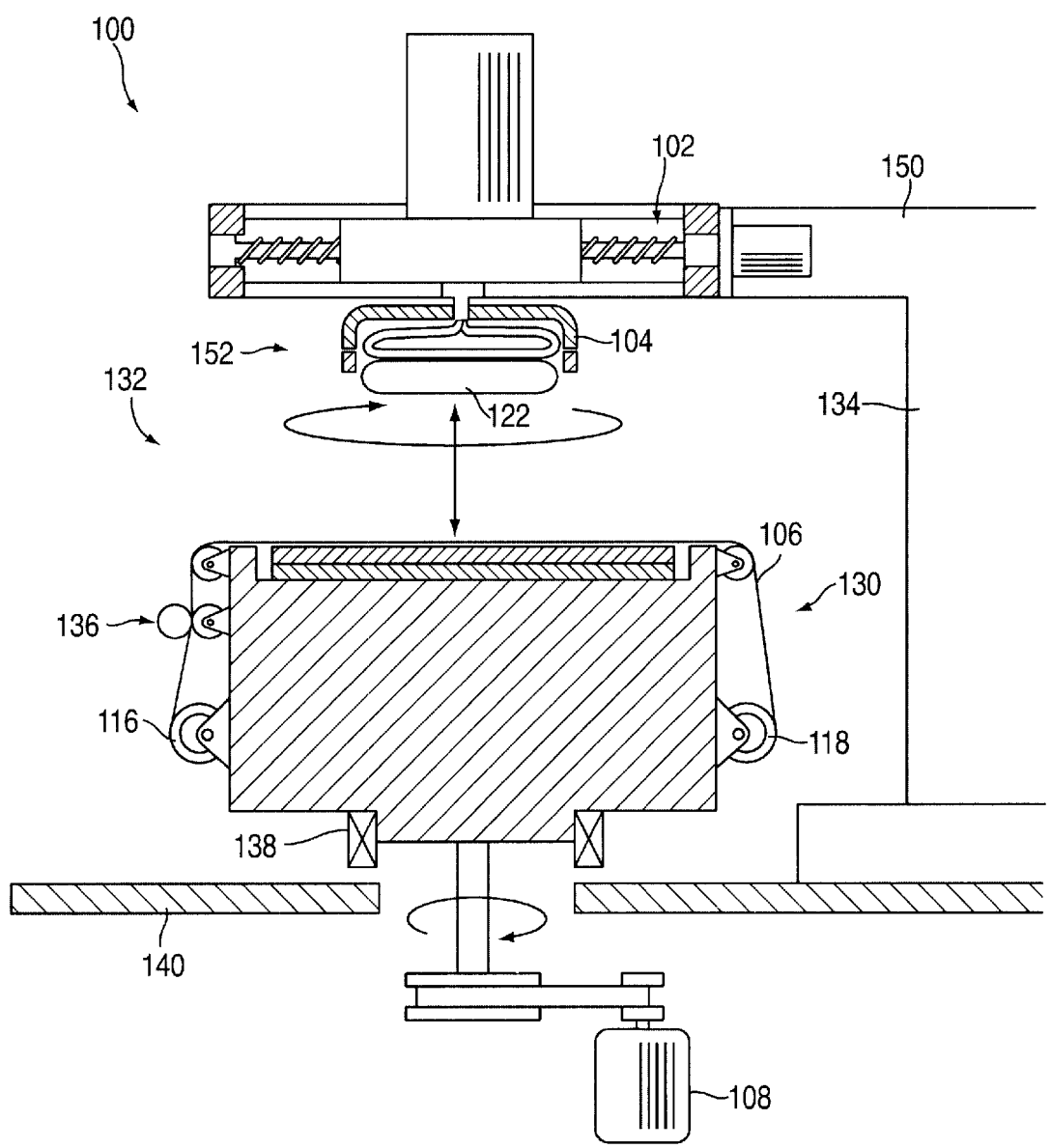
FIG. 1 is a partial sectional view of one embodiment of a chemical mechanical planarization system of the invention.

FIG. 1 depicts a partial sectional view of one embodiment of a chemical mechanical polisher 100 having one or more polishing stations 132 that incorporates a platen assembly 130 configured to retain polishing material. One polisher 100 that can be used to advantage with the present invention is a REFLEXION™ chemical mechanical polisher, manufactured by Applied Materials, Inc., located in Santa Clara, Calif. Although the platen assembly 130 is described in one configuration of a chemical mechanical polisher, one skilled in the art may adapt the polishing material retaining aspects of the platen assembly 130 as taught and described herein to other chemical mechanical polishers that utilize polishing material in web form.

An exemplary polisher 100 in which the invention may be used to advantage is generally described in U.S. patent application Ser. No. 09/244,456, filed Feb. 4, 1999 to Birang et al., which is incorporated herein by reference in its entirety. The polisher 100 generally includes a plurality of polishing stations 132, a base 140 and a carousel 134 that supports a plurality of polishing head assemblies 152. FIG. 1 illustrates a portion of the polisher 100 depicting one of the polishing stations 132 and a corresponding polishing head assembly 152.

Generally, the carousel 134 has a plurality of arms 150, one of which is shown supporting one of the polishing head assemblies 152. The carousel 134 is indexable such that the polishing head assemblies 152 may be moved between the polishing stations 132 and a transfer station (not shown). The polishing head assembly 152 generally comprises a polishing head 104 coupled by a drive system 102 to the carousel 134. The polishing head 104 retains a substrate 122 during polishing. The drive system 102 generally provides linear and rotational motion to the polishing head 104. In one embodiment, the polishing head 104 is a TITAN HEAD™ wafer carrier, manufactured by Applied Materials, Inc., of Santa Clara, Calif.

Disposed between the polishing head assembly 152 and the polishing station 132 is a polishing material 106. The polishing material 106 may comprise a web or a pad. In one embodiment, the polishing material 106 is in the form of a web disposed atop the polishing station 132 between a supply roll 116 and a take-up roll 118. The supply roll 116 is disposed on one side of the polishing station 132 and contains an unused portion of the web of polishing material 106. The take-up roll 118 is disposed on the opposing side of the polishing station 132 and holds a used portion of the web of polishing material 106. The web of polishing material 106 is periodically advanced between the supply roll 116 and the take-up roll 118 by an indexer 136. The indexer 136 may include, for example, a pair of pinch rollers that may be controllably driven to advance the web of polishing material 106 a predetermined amount.

In one embodiment, the polishing material 106 comprises a plurality of abrasive particles suspended in a resin binder that is disposed in discrete elements on a backing sheet. Examples of such fixed abrasive polishing material are available from Minnesota Manufacturing and Mining Company of Saint Paul, Minn. Alternatively, the polishing material 106 may comprise a conventional polishing material such as foamed polyurethane. Examples of such polishing materials are available from Rodel Inc., of Newark, Del.

The polishing station 132 generally includes the platen assembly 130 that is rotatably disposed on the base 140. The platen assembly 130 is supported above the base 140 by a bearing 138 so that the platen assembly 130 may rotate in relation to the base 140. Conventional bearings, rotary unions and slip rings (not shown) are provided such that electrical, mechanical, pneumatic, control signals and connections may be coupled between the base 140 and the rotating platen assembly 130. The platen assembly 130 is typically coupled to a motor 108 that provides the rotational motion to the platen assembly 130.

Figure 2A:
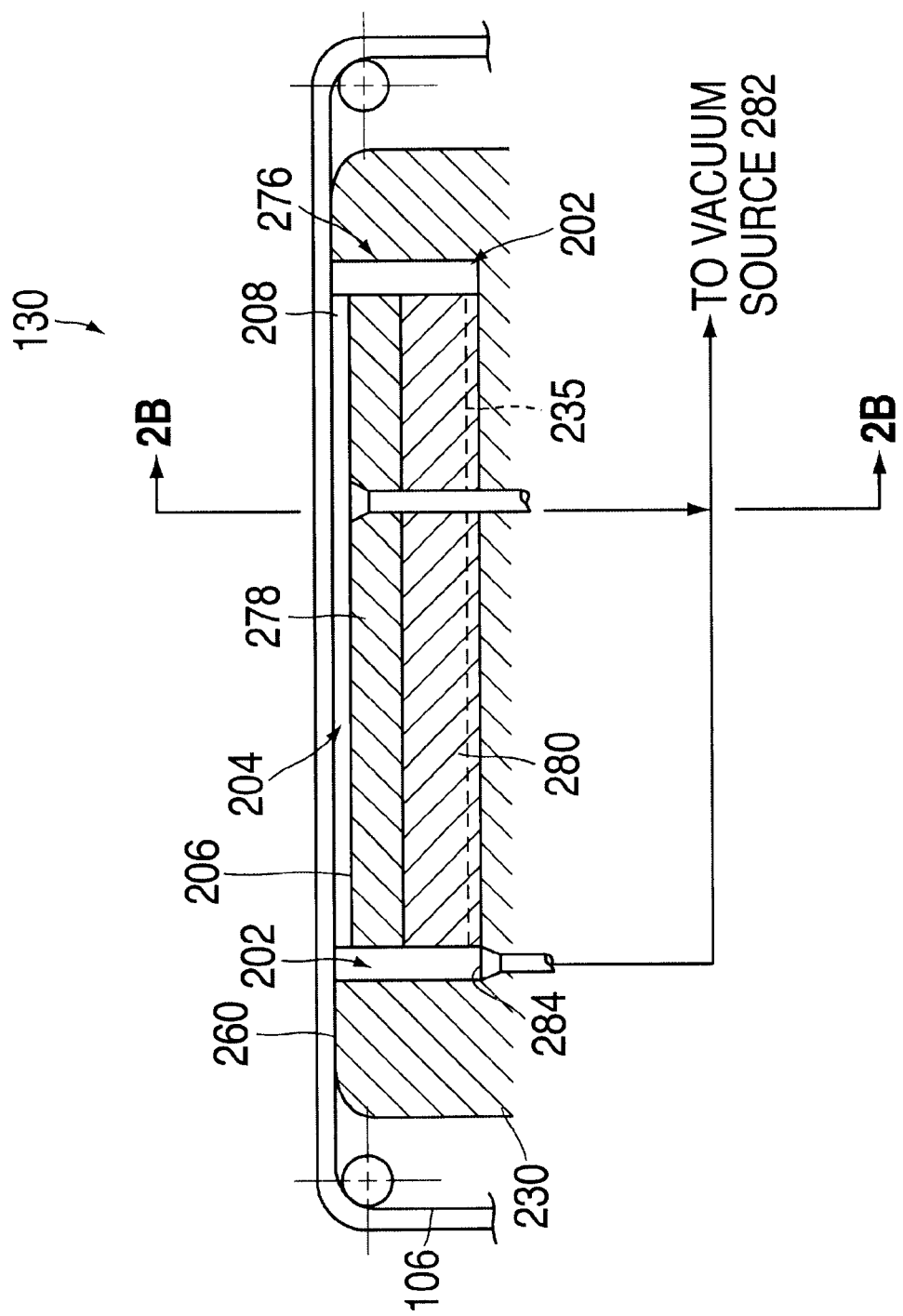
FIG. 2A is a partial sectional view of a platen assembly.
Figure 2B:
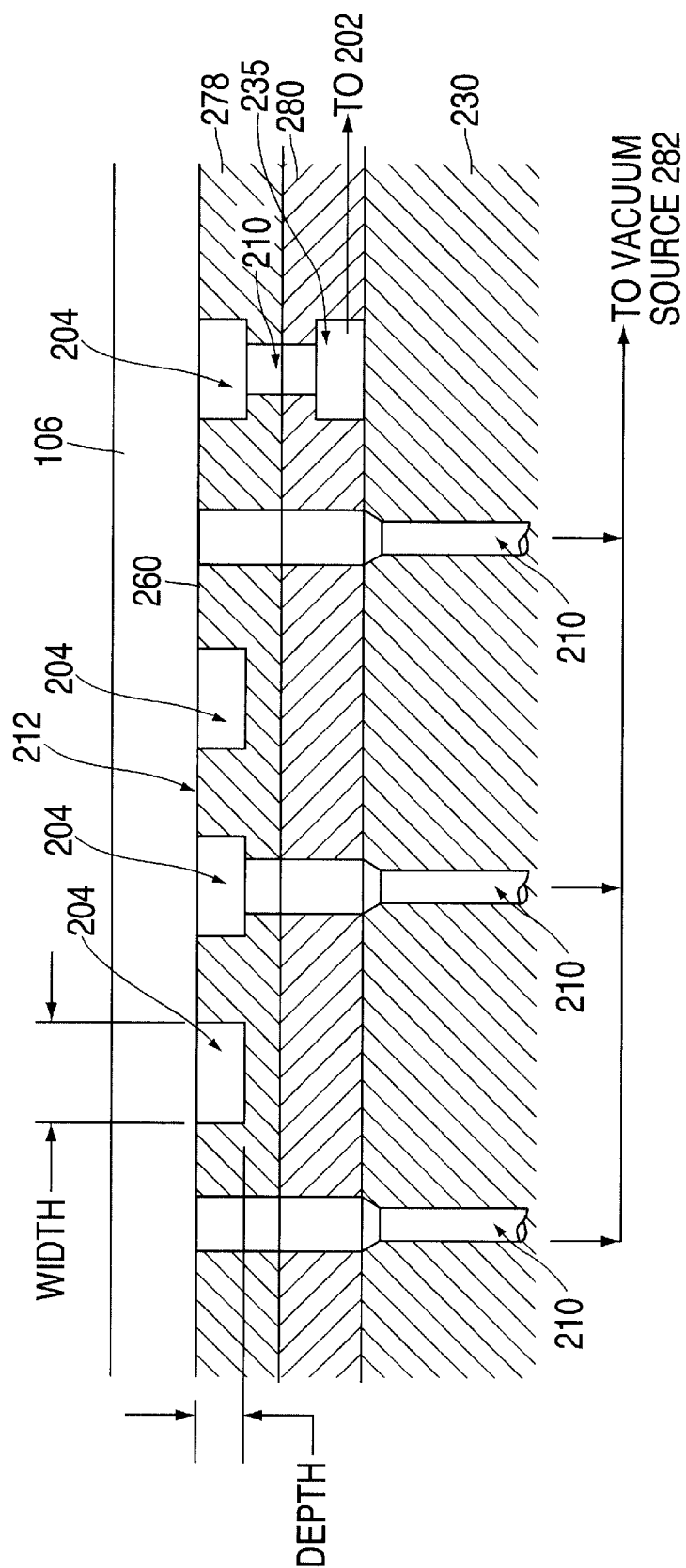
FIG. 2B is a sectional view taken along section line 2B—2B of FIG. 2A.

FIGS. 2A and 2B depict sectional views of the platen assembly 130. The polishing assembly 130 generally comprises a platen 230 that supports the polishing material 106.

The platen 230 is typically comprised of aluminum. The platen 230 has a support or top surface 260 that supports the web of polishing material 106. A center recess 276 is disposed in the top surface 260 and extends into the platen 230.

The top surface 260 of the platen 230 includes a groove 202 formed near the perimeter of the platen 230. The groove 202 typically extends along at least two ends of the platen 230 or may extend completely along the entire perimeter of the platen 230. A polishing area 212 is defined on the top surface 260 inward of the groove 202 as the area where the substrate is processed. Generally, the groove 202 is coupled to a vacuum source 282 by a port 284 disposed in the groove 202. When a vacuum is drawn through the vacuum port 284, fluid (primarily air) removed from between the polishing material 106 and the platen 230 causes the polishing material 106 to be firmly secured to the top surface 260. An example of such polishing material retention system is disclosed in U.S. patent application Ser. No. 09/258,036, filed Feb. 25, 1999, by Sommer et al., which is incorporated herein by reference in its entirety.

A subpad 278 and a subplate 280 are disposed in the center recess 276. The subpad 278 generally maintains the polishing material 106 parallel to the plane of the substrate 122 held in the polishing head 104 and promotes global planarization of the substrate 122. The subpad 278 is typically a polymer, for example, polycarbonate on top of some foam layer. Generally, the hardness or durometer of the subpad may be chosen to produce a particular polishing result. The subplate 280 is positioned between the subpad 278 and the bottom of the recess 276 such that the upper surface of the subpad 278 is coplanar with, and is defined by the top surface 260 of the platen 230.

The top surface 260 of the platen assembly 130 includes a plurality of channels 204 formed therein. In one embodiment, at least one or more of the channels 204 formed in the subpad 278 have a first end 206 and a second end 208. The first and second ends 206 and 208 are coupled to the groove 202 on one side of the platen 230 and a second end 208 that is coupled to the groove on the other side of the platen 230. As vacuum is applied to the groove 202, the channels 204 pull fluid trapped beneath the web of polishing material 106 into the groove 202 and out through the port 284. The web of polishing material 106 is pulled by the vacuum in the groove 202 and secured flush against the top surface 260 of the platen assembly 130. In configurations having the subpad 278 separated from the groove 302 by a portion of the paten 230, the channels 204 may extend through both the platen 230 and the subpad 278.

Optionally, one or more passages 210 are disposed through the platen 230 and the subpad 278. The passages 210 are coupled to the vacuum source 282. Generally, at least one of the channels 204 is coupled by one or more passages 210 to the vacuum source 282. Alternatively, some or all of the passages 210 may be coupled directly to the top surface 260 bypassing the channels 204. The channels 204 may be coupled to the vacuum source 282 (or other vacuum source not shown) solely by the passages 210, or by both the passages 210 and the groove 202. The channels 204 coupled to the vacuum source 282 quickly remove fluid trapped under the polishing material 106, efficiently drawing the polishing material 106 against the top surface of the platen assembly 130. A valve (not shown) disposed between the vacuum source and channels 204 additionally allows the channels 204 to be vented or pressurized to remove the vacuum between the polishing material 106 and the top surface 260.

Alternatively, one or more of the channels 204 may be coupled to the groove 202 via a lateral channel 235 disposed beneath the top surface 260. The lateral channel 235 may be disposed in the subpad 278, the subplate 280 or the platen 230. Typically, the lateral channel 235 is coupled to the channel 204 by the passage 210. Optionally, some or all of the passages 210 may be disposed between the lateral channel and top surface 260 without communicating through one of the channels 204.

Figure 3:
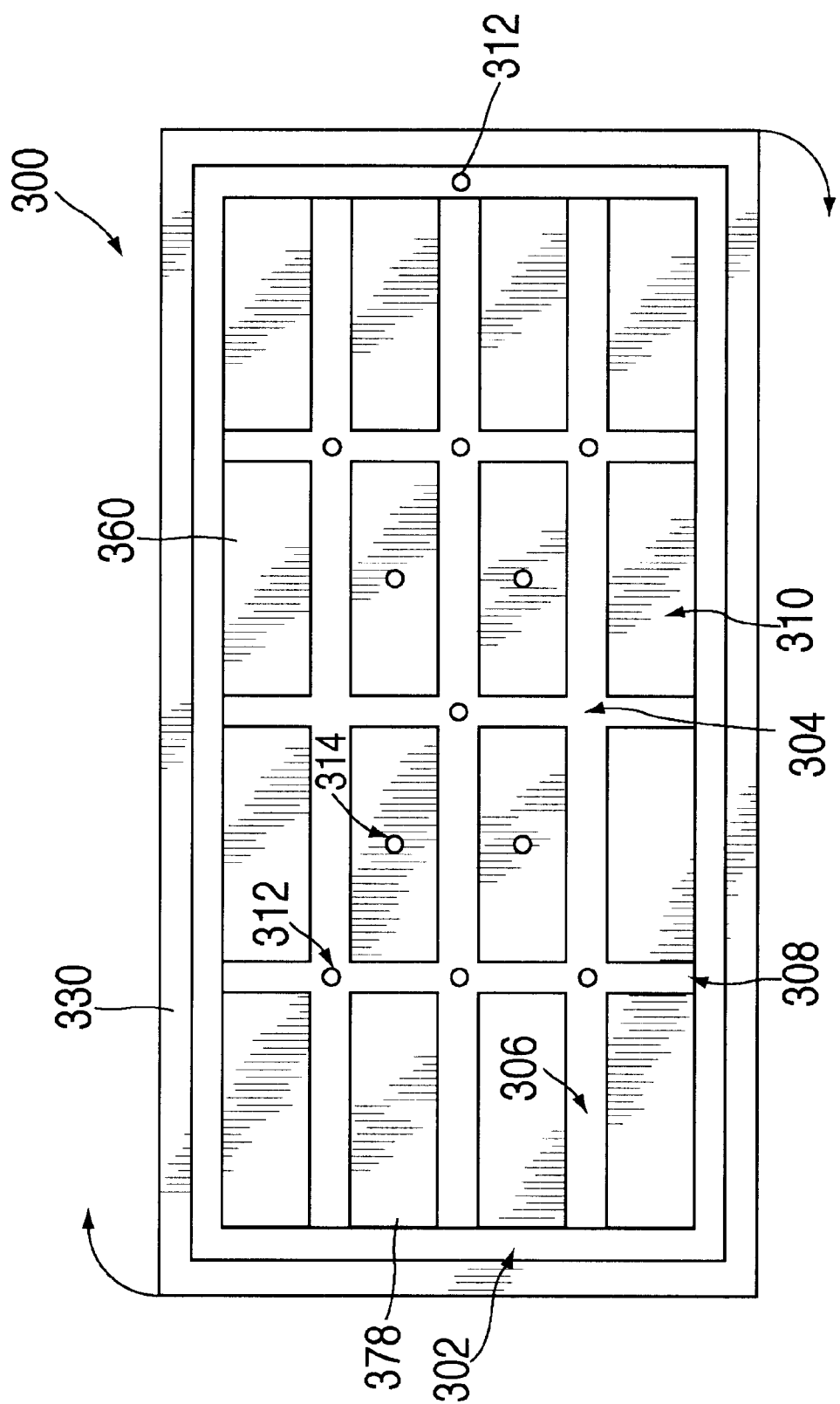
FIG. 3 is a plan view of another embodiment of a platen assembly.

A top view of one embodiment of a platen assembly 300 having a platen 330 and subpad 378 is depicted in FIG. 3.

Channels 304 disposed in a top surface 360 of the platen assembly 300 comprise a series of longitudinal channels 306 orientated in a first direction generally paralleling the edge of the platen 330. Optionally, the channels 304 may additionally include a series of lateral channels 308 that intersect the longitudinal channels 306, forming a grid pattern. In one embodiment, the channels 306 and 308 intersect at a right angle. The grid pattern disposed beneath the polishing material (not shown in FIG. 3) vents fluids that may become trapped as the polishing material 106 is sealed against the platen 330 upon application of vacuum to a groove 302. The grid of channels 304 quickly and efficiently vacuum and vents the trapped fluid, substantially eliminating fluid bubbles beneath the web and advantageously securing the polishing material 106 against the top surface 360 of the polishing assembly 300. Alternatively, the channels 304 may be formed in other patterns such as unidirectional channels, radial channels, concentric channels, circular channels, intersecting radial and concentric channels, curvilinear channels, a network of channels or other channel orientations that may be configured singularly, or in combination with other patterns.

The plate assembly 300 may also include a first set of passages 312 disposed in the platen 330 and subpad 378. The passages 312 may be disposed randomly, or at predefined locations, such as the intersection of the channels 304. The passages 312 couples the channels 304 to the vacuum source (not shown in FIG. 3) which enhance the removal of fluid adjacent the top surface 360. Optionally, a second set of passages 314 may be disposed through the platen assembly 300, or elsewhere, coupling the vacuum source directly to the top surface 360.

When vacuum is applied to the channels 304 and groove 302, the polishing material 106 is advantageously pulled flush against the polishing area 310 of the platen assembly 300 thus enhancing polishing quality. To avoid excessive disruption of the top surface 360 in the polishing area 310, the channels 304 formed in the polishing area 310 of platen assembly 300 generally should have a depth less than about 40 mils and a width less than about 20 mils. Generally, the channel profiles may have various geometric form, for example, square, triangular, rounded, oval, rectangular or other profile.

Figure 4:
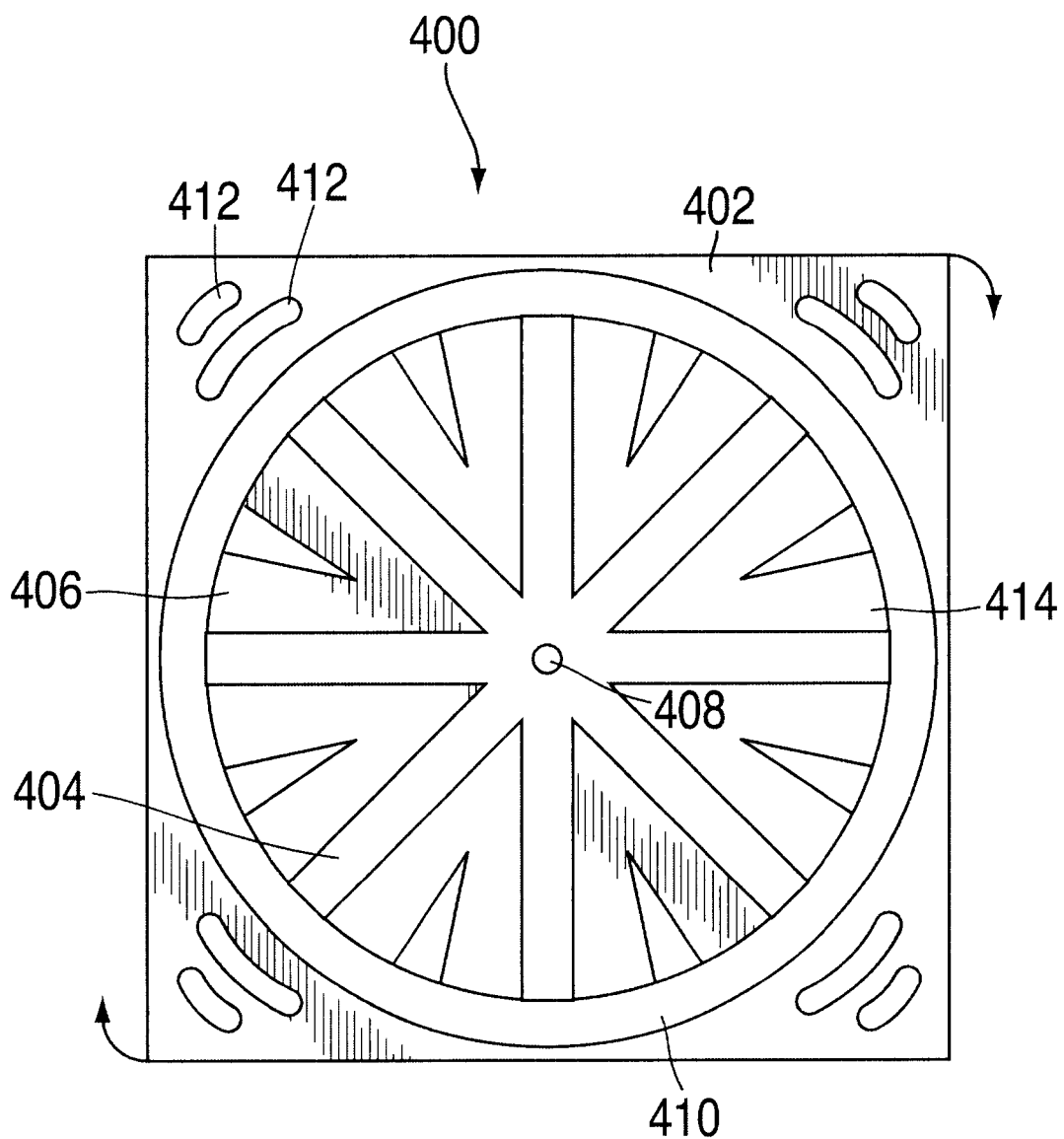
FIG. 4 is a partial sectional view of another embodiment of a platen assembly.

FIG. 4 depicts an example of another embodiment of a platen assembly 400. The platen assembly 400 includes a platen 302 and subpad 414. One or both of the platen 402 and subpad 414 have channels 404 disposed therein. The channels 404 are disposed in a polishing area 406 of the platen 402 and arranged in a pattern, such as a polar array. The polar array of channels 404 is typically centered in the polishing area 406. The channels 404 are generally coupled to a groove 410 that circumscribes the polishing area 406. The groove 410 may be circular, polygonal or other shape. At least some of the channels 404 are coupled to at least one vacuum port 408. The port 408 is typically centrally positioned in the platen 402 but may be disposed in another location. Optionally, additional vacuum ports may be coupled to the channels 404 or in communication directly to the top surface of the platen 402. On or more secondary vacuum channels 412 may be disposed on the platen 402 outward of the polishing area 406. The secondary vacuum channels 412 may be of any configuration and can be coupled to the vacuum source directly or through the groove 410. Typically, the width of the secondary vacuum channels is larger than the channels 404, thus permitting faster venting and vacuum application, more efficient fluid removal and greater holding force to be applied outside of the polishing area 416.

Referring primarily to FIGS. 1 and 2, in operation, vacuum is applied to the web of polishing material 106 to secure the polishing material to the platen assembly 130. The polishing material 106 is sealed to the platen 230 by evacuating the groove 202. The area beneath the polishing material 106 inward of the groove 202 (i.e., the polishing area 212) is evacuated through the channels 204 and the port 284. Having the channels 204 evacuated into both the groove 202 and though the passages 210 allows for fluid to quickly be removed from under the web of polishing material 106 and provides for quick and uniform vacuum holding forces across the width of the polishing material that secures the polishing material flush against the top surface 260 of the platen assembly 130. Moreover, the channels 204 and passages 210 allow the vacuum between the polishing material 106 and top surface 260 to be quickly vented. Thus, the rapid application and removal of the vacuum advantageously reduces the system's cycle time.

One the web of polishing material 106 is secured flush to the platen assembly 130, the substrate 122 retained in the polishing head 104 is pressed against the polishing material 106. The substrate 122 is moved relative to the polishing material 106 in a programmed polishing motion in the presence of a polishing fluid to perform a chemical mechanical polishing process.

Although the teachings of the present invention that have been shown and described in detail herein, those skilled in the art can readily devise other varied embodiments that still incorporate the teachings and do not depart from the scope and spirit of the invention.

What is claimed is:

1. Apparatus for retaining polishing material comprising:
    a platen having a top surface adapted to support the polishing material;
    a plurality of channels formed in a polishing area of the top surface, wherein the plurality of channels includes a grid of intersecting channels;
    one or more vacuum ports disposed in the platen and adapted to be coupled to a vacuum source, at least one of the ports in communication with at least one of the channels to retain the polishing material on the top surface of the platen; and
    a subpad disposed in the platen and at least a portion of the channels are formed in the subpad.

2. The apparatus of claim 1 further comprising a plurality of vacuum ports disposed through the subpad and coupled to the channels.

3. The apparatus of claim 1, wherein the top surface further comprise a circumferential groove formed outward of the polishing area.

4. The apparatus of claim 3 further comprising additional vacuum channels disposed outward of the circumferential groove.

5. The apparatus of claim 4, wherein a width of the additional vacuum channels is wider that a width of the channels disposed inwards of the circumferential groove.

6. The apparatus of claim 3 further comprising a subpad disposed in the platen, the subpad having at least a portion of the channels formed in the subpad and at least one of the channels in fluid communication with the circumferential groove.

7. The apparatus of claim 1, wherein the channels have a depth of less than about 40 mils.

8. The apparatus of claim 1, wherein the channels are arranged in a pattern.

9. The apparatus of claim 8, wherein the pattern further comprises a grid, unidirectional channels, radial channels, concentric channels, circular channels, intersecting radial and concentric channels, curvilinear channels, a network of channels, or a combination thereof.

10. The apparatus of claim 8, wherein the channels are coupled to the port at a first end and coupled to a circumscribing groove disposed in the perimeter of the platen at a second end.

11. The apparatus of claim 1, wherein the plurality of channels have a width less than about 20 mils.

12. The apparatus of claim 1, wherein the plurality of channels includes at least one channel orientated parallel to an edge of the polishing material.

13. The apparatus of claim 1, wherein the plurality of channels includes at least one channel orientated perpendicular to an edge of the polishing material.

14. The apparatus of claim 1, wherein the one or more ports comprise a plurality of vacuum ports coupled to the channels.

15. Apparatus for retaining polishing material comprising:
a platen having a top surface adapted to support the polishing material;
a groove disposed in the top surface proximate the perimeter of the platen;
a plurality of channels formed in a polishing area of the top surface inward of the groove, at least one of the channels in fluid communication with the groove, wherein the polishing area of the top surface further comprises a subpad disposed in the platen and at least a portion of the channels are formed in the subpad; and
one or more vacuum ports disposed in the platen and adapted to be coupled to a vacuum source, at least one of the ports in communication with at least one of the channels to retain the polishing material on the top surface of the platen.

16. The apparatus of claim 15, wherein the one or more vacuum ports comprise one port disposed in the groove and a plurality of vacuum ports coupled to the channels.

17. The apparatus of claim 16, wherein the channels form a grid on at least a portion of the top surface.

18. The apparatus of claim 15, wherein one or more of the channels further comprises a first end and a second end, the first end of the channel coupled to one portion of the groove and the second end of the channel coupled to another portion of the groove.

19. The apparatus of claim 15 further comprising a plurality of vacuum ports coupled to the channels.

20. The apparatus of claim 15, wherein the channels have a width of less than about 20 mils and a depth of less than about 40 mils.

21. Apparatus for retaining polishing material comprising:
a platen having a top surface adapted to support the polishing material;
a plurality of channels formed in a polishing area of the top surface;
a circumferential groove formed in the top surface outward of the polishing area;
one or more vacuum ports disposed in the platen and adapted to be coupled to a vacuum source, at least one of the ports in communication with at least one of the channels to retain the polishing material on the top surface of the platen; and
a subpad disposed in the platen and at least a portion of the channels are formed in the subpad.

22. The apparatus of claim 21 further comprising a plurality of vacuum ports disposed through the subpad and coupled to the channels.

23. The apparatus of claim 21 further comprising additional vacuum channels disposed outward of the circumferential groove.

24. The apparatus of claim 23, wherein a width of the additional vacuum channels is wider that a width of the channels disposed inwards of the circumferential groove.

25. The apparatus of claim 21 further comprising a subpad disposed in the platen, the subpad having at least a portion of the channels formed in the subpad and at least one of the channels in fluid communication with the circumferential groove.

26. The apparatus of claim 21, wherein the channels have a depth of less than about 40 mils.

27. The apparatus of claim 21, wherein the channels are arranged in a pattern.

28. The apparatus of claim 27, wherein the pattern further comprises a grid, unidirectional channels, radial channels, concentrical channels, circular channels, intersecting radial and concentric channels, curvilinear channels, a network of channels, or a combination thereof.

29. The apparatus of claim 27, wherein the channels are coupled to the port at a first end and coupled to a circumscribing groove disposed in the perimeter of the platen at a second end.

30. The apparatus of claim 21, wherein the plurality of channels includes at least one channel orientated parallel to an edge of the polishing material.

31. The apparatus of claim 21, wherein the plurality of channels includes at least one channel orientated perpendicular to an edge of the polishing material.

32. The apparatus of claim 21, wherein the plurality of channels includes a grid of intersecting channels.

33. The apparatus of claim 32, wherein the one or more ports comprise a plurality of vacuum ports coupled to the channels.

34. Apparatus for retaining polishing material comprising:
a platen having a top surface adapted to support the polishing material;
a plurality of channels formed in a polishing area of the top surface, wherein the plurality of channels includes a grid of intersecting channels arranged in a pattern that further comprises a grid, unidirectional channels, radial channels, concentric channels, circular channels, intersecting radial and concentric channels, curvilinear channels, a network of channels, or a combination thereof;
one or more vacuum ports disposed in the platen and adapted to be coupled to a vacuum source, at least one of the ports in communication with at least one of the channels to retain the polishing material on the top surface of the platen; and
a subpad disposed in the platen and at least a portion of the channels are formed in the subpad.

35. The apparatus of claim 34 further comprising a plurality of a vacuum ports disposed through the subpad and coupled to the channels.

36. The apparatus of claim 34, wherein the top surface further comprises:
   a circumferential groove formed outward of the polishing area; and
   additional vacuum channels disposed outward of the circumferential groove.

37. The apparatus of claim 36, wherein a width of the additional vacuum channels is wider that a width of the channels disposed inward of the circumferential groove.

38. The apparatus of claim 34 wherein the top surface further comprises:
   a circumferential groove formed outward of the polishing area and having at last one of the channels in fluid communication with the circumferential groove.

39. The apparatus of claim 34, wherein the channels have a depth of less than about 40 mils.

40. The apparatus of claim 34, wherein the channels are arranged in a pattern and coupled to the port at a first end and coupled to a circumscribing groove disposed in the perimeter of the platen at a second end.

41. The apparatus of claim 34, wherein the plurality of channels includes at least one channel orientated parallel to an edge of the polishing material.

42. The apparatus of claim 34, wherein the plurality of channels includes at least one channel orientated perpendicular to an edge of the polishing material.

43. The apparatus of claim 34, wherein the one or more ports comprise a plurality of vacuum ports coupled to the channels.

* * * * *

UNITED STATES PATENT AND TRADEMARK OFFICE
CERTIFICATE OF CORRECTION

PATENT NO.   : 6,592,439 B1
DATED        : July 15, 2003
INVENTOR(S)  : Li et al.

It is certified that error appears in the above-identified patent and that said Letters Patent is hereby corrected as shown below:

Column 2,
Line 27, please change "at op surface" to -- a top surface --.

Column 5,
Line 58, please change "302" to -- 402 --.

Column 6,
Line 4, please change "On" to -- One --.
Line 22, please change "though" to -- through --.
Line 32, please change "One" to -- Once --.

Column 9,
Line 16, please change "last" to -- least --.

Signed and Sealed this

Twenty-third Day of December, 2003

JAMES E. ROGAN
*Director of the United States Patent and Trademark Office*